(12) United States Patent
McBride et al.

(10) Patent No.: US 6,434,723 B1
(45) Date of Patent: Aug. 13, 2002

(54) SYSTEM AND METHOD FOR EVALUATING A VERY LARGE SCALE INTEGRATED CIRCUIT FOR POTENTIAL DESIGN ERRORS

(75) Inventors: John G McBride, Ft Collins; Thomas N Indermaur, Denver, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/318,985

(22) Filed: May 26, 1999

(51) Int. Cl.[7] ............................................... G06F 17/50
(52) U.S. Cl. ............................................... 716/4; 716/5
(58) Field of Search ............................ 716/4, 5; 703/14, 703/13, 15

(56) References Cited

U.S. PATENT DOCUMENTS

| | | | | |
|---|---|---|---|---|
| 5,247,468 A | * | 9/1993 | Henrichs et al. | 703/14 |
| 5,765,194 A | * | 6/1998 | McBride | 711/138 |
| 5,815,655 A | * | 9/1998 | Koshiyama | 714/45 |
| 6,053,947 A | * | 4/2000 | Parson | 703/14 |
| 6,077,717 A | * | 6/2000 | McBride | 438/10 |
| 6,094,654 A | | 7/2000 | Van Huben et al. | 707/8 |
| 6,249,899 B1 | * | 6/2001 | McBride et al. | 716/4 |
| 6,260,180 B1 | * | 7/2001 | McBride | 716/5 |
| 6,275,970 B1 | * | 8/2001 | McBride | 716/4 |
| 6,279,143 B1 | * | 8/2001 | McBride et al. | 716/5 |
| 6,295,632 B1 | * | 9/2001 | McBride | 716/6 |
| 6,301,691 B1 | * | 10/2001 | McBride | 716/5 |
| 6,308,301 B1 | * | 10/2001 | McBride et al. | 716/4 |
| 6,311,314 B1 | * | 10/2001 | McBride | 716/6 |

OTHER PUBLICATIONS

I. Emre Telatar, "Zero–Error List Capacities of Discrete Memoryless Channels," IEEE, Sep. 1995, pp. 8.*
Nicholls et al, "Experimental Evaluation of Concurrent Fault Simulation Algorithms on Scalable, Hierarchically Defined Test Cases," IEEE, 1990, pp. 698–705.*

* cited by examiner

*Primary Examiner*—Vuthe Siek (57) ABSTRACT

The present invention is generally directed to a system and method for evaluating a very large scale integrated circuit design in a structured, hierarchical fashion. In accordance with one aspect of the invention, a method evaluates a first circuit portion for a variety of potential errors and generates a first list of potential errors identified in the first circuit portion. The method further includes the step of adding at least one of the potential errors to a waiver file. The method further includes the step of examining a second circuit portion for a variety of potential errors, except those errors listed in the waiver file. In one embodiment, the step of examining the second circuit portion may be executed in a variety of ways. In one embodiment, the step may be configured to evaluate the second circuit portion for a number of potential errors. For any error(s) so identified, the method may add the errors to an error listing that is to be reported. However, the method may then exclude or omit from this listing any errors (or tests) listed in a waiver file. An associated system is also provided.

19 Claims, 6 Drawing Sheets

SYSTEM AND METHOD FOR EVALUATING A VERY LARGE SCALE INTEGRATED CIRCUIT FOR POTENTIAL DESIGN ERRORS

BACKGROUND OF THE INVENTION

1. Field of the Invention

The present invention generally relates to computer-aided circuit design systems, and more particularly to a system and method for evaluating a netlist of a very large scale integrated (VLSI) circuit for various potential design errors.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electromechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will typically include multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using Boolean equations. The structural description is represented as a netlist of cells, sometimes referred to herein as leaf cells. Examples of leaf cells include full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain circuit configurations that may lead to operational uncertainty or performance problems. However, VLSI circuits contain numerous circuit primitives. Indeed, VLIS circuit often contain thousands of gates. As a result, design tools that are configured to evaluate VLSI circuits often identify numerous errors. Therefore, error listings, or listings that identify potential errors, may be very lengthy and therefore difficult, if not overwhelming, for a designer to deal with.

Accordingly, there is a heretofore unaddressed need to provide a design tool that evaluates a netlist or other electronic file representative of a VLSI circuit design to identify potential errors and generate lists of such potential errors, in a manner that is very manageable for the designer.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for evaluating a very large scale integrated circuit design in a structured, hierarchical fashion. In accordance with one aspect of the invention, a method evaluates a first circuit portion for a variety of potential errors and generates a first list of potential errors identified in the first circuit portion. The method further includes the step of adding at least one of the potential errors to a waiver file. The method further includes the step of examining a second circuit portion for a variety of potential errors, except those errors listed in the waiver file.

In one embodiment, the step of examining the second circuit portion may be executed in a variety of ways. In one embodiment, the step may be configured to evaluate the second circuit portion for a number of potential errors. For any error(s) so identified, the method may add the errors to an error listing that is to be reported. However, the method may then exclude or omit from this listing any errors (or tests) listed in a waiver file. Alternatively, the method may be configured to evaluate a second circuit portion for a number of predefined potential errors. However, before evaluating the second circuit portion for the various potential errors, the method may first examine the waiver file and exclude errors listed therein from the second examination step. That is, rather than examining the second circuit portion for all potential errors, the method may examine the second circuit portion for all potential errors (predefined), except those listed in a waiver file.

In accordance with one embodiment of the present invention, the method may also consult and/or utilize the waiver file in connection with the examination of the first circuit portion, in the same way that it consults/utilizes the waiver file in connection with the examination of the second circuit portion. In accordance with yet a further embodiment of the invention, the first circuit portion may correspond to one or more leaf cells, while the second circuit portion may include a larger circuit that encompasses the one or more leaf cells.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 1A:
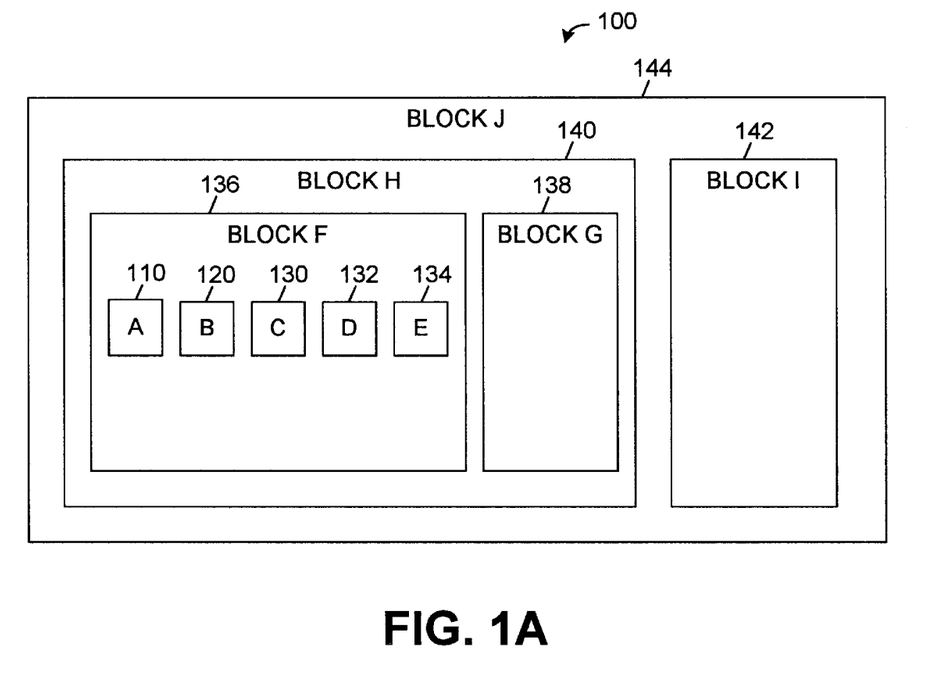
FIGS. 1A and 1B are block diagrams that illustrate the hierarchical structure of the design evaluation tool of the present invention.

Referring now to the drawings, reference is made to FIG. 1A, which is a block diagram that illustrates the hierarchical analysis structure implemented by the present invention. Specifically, the block diagram of FIG. 1A shows a plurality of blocks, some disposed in side-by-side fashion, while others are encapsulated within larger blocks. Each block corresponds to a circuit portion that is to be separately evaluated for potential design errors in accordance with the present invention.

At the lowest level, leaf cells 110, 120, 130, 132, and 134 define a basic functional circuit unit. A leaf cell may comprise a single schematic primitive, or alternatively, may comprise a gate comprised of multiple schematic primitives. As is known, a schematic primitive is a basic unit, such as a FET, a capacitor, or a resistor. In contrast, a leaf cell is a fundamental circuit unit, such as a NAND gate, a NOR gate, a latch, and adder, etc.

The present invention provides a hierarchical approach for the examination of circuits, particularly in a large VLSI design, which minimizes the number of potential errors reported to the user (i.e., design engineer) at any given time. The invention achieves this hierarchical approach by beginning at a low level, and evaluating a circuit portion, which may be used as a building block to other portions of the circuitry in the VLSI design. In this way, design errors in such lower-level circuit building blocks may be identified and corrected at an early stage in the design evaluation, before evaluating larger portions of the VLSI circuit.

By way of illustration, consider a VLSI circuit that may be, for example, a microprocessor circuit. At the lowest level, leaf cells like AND gates, OR gates, etc. may be used in the circuit design. Larger circuit portions, such as adders, shift registers, etc. may be comprised of the use smaller leaf cells. Even larger circuits may be comprised of the secondary or intermediate circuit blocks. For example, an arithmetic logic unit may be comprised of multiple adders and shift registers. Depending upon the circuit being design, even larger circuits may be constructed from the arithmetic logic unit and other circuitry.

It will be appreciated that numerous design errors may be reported, if the entirety of a microprocessor circuit design, for example, were evaluated before running any automated error checking on lower level components of the microprocessor. However, in accordance with the present invention, such a circuit may be tested in stages. At a first stage, for example, leaf cells, such as AND gates and OR gates, may be evaluated for potential errors. One such error may be the ratio of PFETs to NFETs in a NOR gate. Specifically, some design guidelines may specify a range for the ratio of the cumulative widths of all PFETs and all NFETs in a NOR gate.

Figure 2:
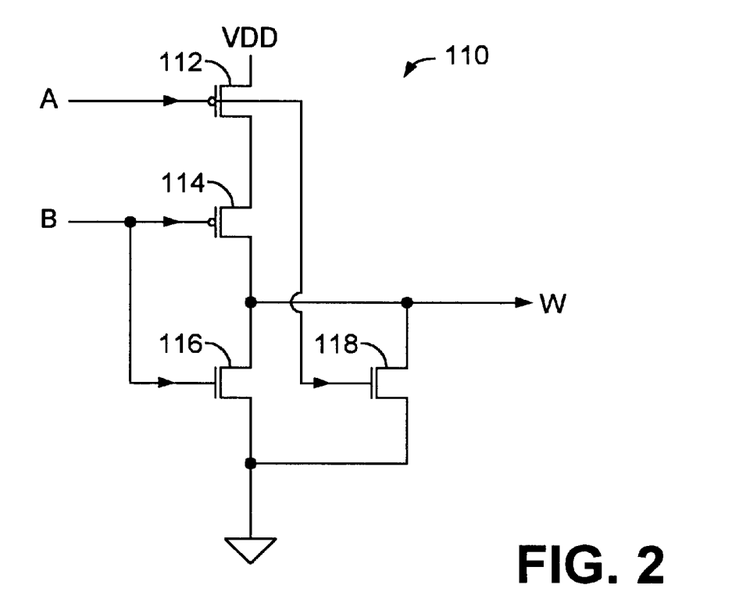
FIG. 2 is a schematic diagram of a circuit configuration more particularly illustrating the hierarchical structure of the design evaluation tool of the present invention.

To better illustrate, reference is made briefly to FIG. 2, which is a schematic of a circuit configuration of a two input NOR gate is shown. As shown, the two input NOR gate 110 is defined by four FETS, including PFETS 112 and 114 and NFETS 116 and 118. The PFETS are channel connected in series between VDD and the output W, and the NFETS are channel connected in parallel between the output W and ground. A first input A to the NOR gate is disposed to drive gate nodes of PFET 112 and NFET 118, while the second input B is disposed to drive gate nodes of PFET 114 and NFET 116.

If, after evaluating the circuit portion of the netlist file that corresponds to the NOR gate, the electrical rules checking design tool determines that the ratio of the cumulative width of the PFETs to NFETs is outside a predetermined range, then an appropriate error message may be generated and presented to the circuit designer. The circuit designer may then determine whether the circuit should be modified, or whether the particular circuit is permissible in the present design. If the circuit is to be modified, then the circuit designer may make that same modification to all NOR gates in the VLSI circuit. Such a modification may be made manually, or alternatively may be automatically made through an appropriate design tool, consistent with the concept and teachings of the present invention. Thereafter, when the circuit evaluating tool of the present invention evaluates larger circuit portions, it will no longer flag the PFET:NFET ratio error, as this defect would have been corrected at an early stage in the circuit evaluation.

Alternatively, if the circuit designer determines that the circuit is, in fact, permissible and no modification needs to be made, the circuit designer may so instruct the evaluation tool of the present invention by listing the identified circuit error in a waiver file. Thereafter, when the design evaluation tool of the present invention evaluates larger circuit blocks it may omit from any listing of potential errors, those errors are listed in the waiver file.

Thus, whether the designer modifies the leaf cell design in response to the identification of potential errors, or whether the designer instructs the evaluation tool of the present invention to disregard the errors by listing the errors in a waiver file, the evaluation tool of the present invention may efficiently evaluate larger circuit portions, without generating an undue number of potential errors.

Having briefly described certain features of the present invention, reference is again made to FIG. 1A, which illustrates the hierarchical structure utilized by the circuit evaluation tool of the present invention. At the lowest level, leaf cells 110, 120, 130, 132, and 134 may be separately designated by the design engineer for evaluation by the examination tool of the present invention, to identify potential design errors. After such errors have been identified and either fixed or waived, the present invention may then evaluate a larger circuit portion, such as block 136. In the illustrated embodiment, circuit block 136 encompasses leaf cells 110, 120, 130, 132, and 134. Additional circuitry (not shown) may also be included within the circuit block 136. A similar design approach may be undertaken for block 138. Specifically, circuit block 138 may also include a number of leaf cells already evaluated in connection with the evaluation of circuit block 136. If additional leaf cells are present within circuit block 138, then the design evaluation tool of the present invention will evaluate those circuit configurations in connection with the remaining circuitry of block 138, and identify any potential errors therein (assuming such errors were not previously fixed or waived). Once the evaluation of both blocks 136 and 138 has been performed, the potential errors identified in those individual blocks may be either corrected or waived by the circuit designer. Thereafter, block 140 may be evaluated. As illustrated, block 140 encompasses both blocks 136 and 138.

Continuing with the hierarchical evaluation of the present invention, additional design errors identified in block 140 may be either corrected or waived. Likewise, circuit block 142 may be separately evaluated for potential design errors. Circuit block 142 may be comprised of leaf cells or circuit blocks which have already been evaluated, such as leaf cells 110, 120, and 130, and circuit blocks 136 and 138. Therefore, any errors identified and circuit block 142 will preferably be errors that the designer has not yet had opportunity to fix or waive. Thereafter, the method may evaluate circuit block 144, which encompasses all previously identified circuit blocks and leaf cells. Additional circuit blocks may be included and evaluated consistent with the hierarchical approach of the present invention.

Figure 1B:
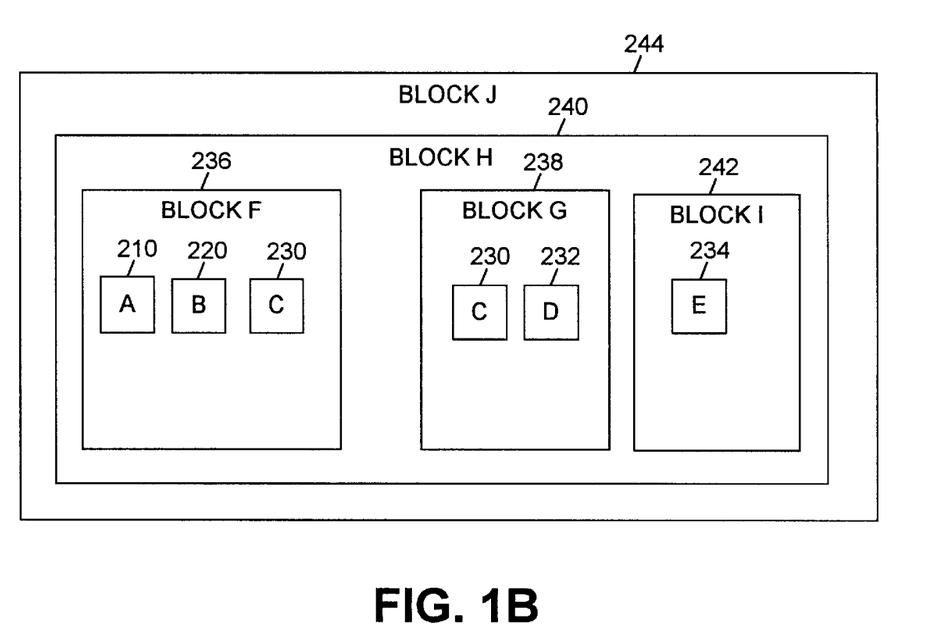

Reference is now made briefly to FIG. 1B, which is a block diagram similar to that of FIG. 1A, but illustrating a slightly different circuit designation. Specifically, leaf cells 210, 220, and 230 are illustrated in circuit block 236. Leaf cell 230 is also illustrated in circuit block 238, along with an additional leaf cell 232. Likewise, an additional leaf cell 234 is illustrated in circuit block 242. The remaining circuit blocks 240 and 244 are configured like the circuit blocks 140 and 144 of FIG. 1A.

It will be appreciated, however, that consistent with the concepts of the present invention, a wide variety of circuit configurations may be designated for the hierarchical evaluation of the present invention. Indeed, a designer need not first separately designate and evaluate leaf cells. Rather, a designer may designate, generically, a first circuit portion that encompasses several leaf cells and run the evaluation tool on the first circuit portion. In operating the inventive evaluation tool in this way, the designer may simply have to address a larger number of potential errors at a given time. Accordingly, it is contemplated that a designer will generally began at a lowest possible level of a circuit, and designate the various building blocks that will be used throughout other portions of the circuit. Once these building block circuit portions have been evaluated, then the designer may either correct errors contained therein, or may specify that such errors be waived thereafter. This way, the same errors will not be identified over and over again to the designer.

Figure 3:
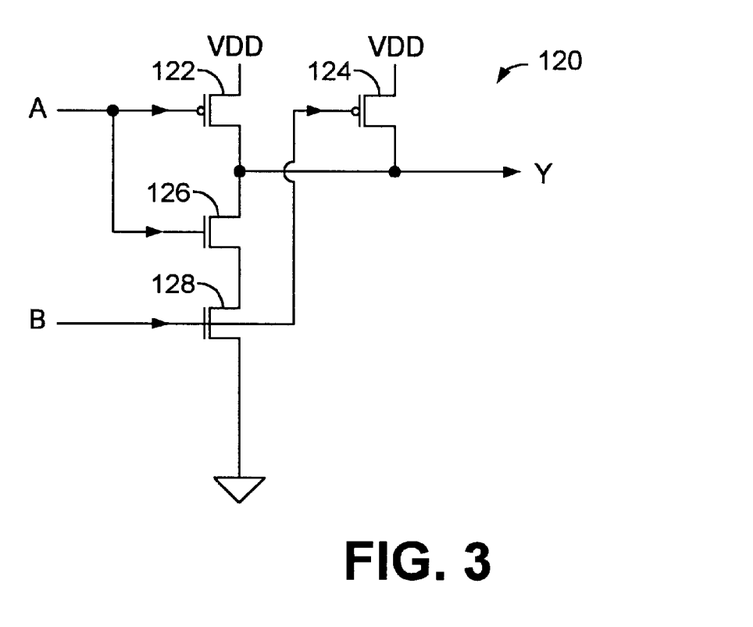
FIG. 3 is a schematic diagram of an alternative circuit configuration illustrating the hierarchical structure of the design evaluation tool of the present invention.

By way of illustration, reference is made again briefly to FIG. 2, which illustrates a two input NOR gate 110, and to FIG. 3, which illustrates a two input NAND gate 120. The schematic diagrams are presented purely for purposes of illustration, as the specific circuit design may vary from implementation to implementation. The circuit of FIG. 2 has been described above, and need not be described again herein. Its purpose for illustration herein is simply to provide one example of leaf cell 110 which may be evaluated in the context of a larger circuit block 136. Likewise, FIG. 3 illustrates an alternative schematic diagram of a differing leaf cell 120, which may be incorporated in a larger circuit block 136. As mentioned above, leaf cell 120 is a two input NAND gate. As is known, a two input NAND gate may be constructed from four FETs 122, 124, 126, and 128. Specifically, a two input NAND gate may be constructed from two PFETs 122 and 124 that are connected in channel parallel fashion between VDD and an output node Y. Likewise, the NAND gate may include a pair of NFETs 126 and 128 that are channel connected in series between the output node Y and ground. Further, and as illustrated, the NFETs 126 and 128 are channel connected in series with PFET 122. One input A of the NAND gate drives any gate node of both PFET 122 and NFET 126. Likewise, the other input of the NAND gate drive the gate nodes of NFET 128 and PFET 124.

Figure 4:
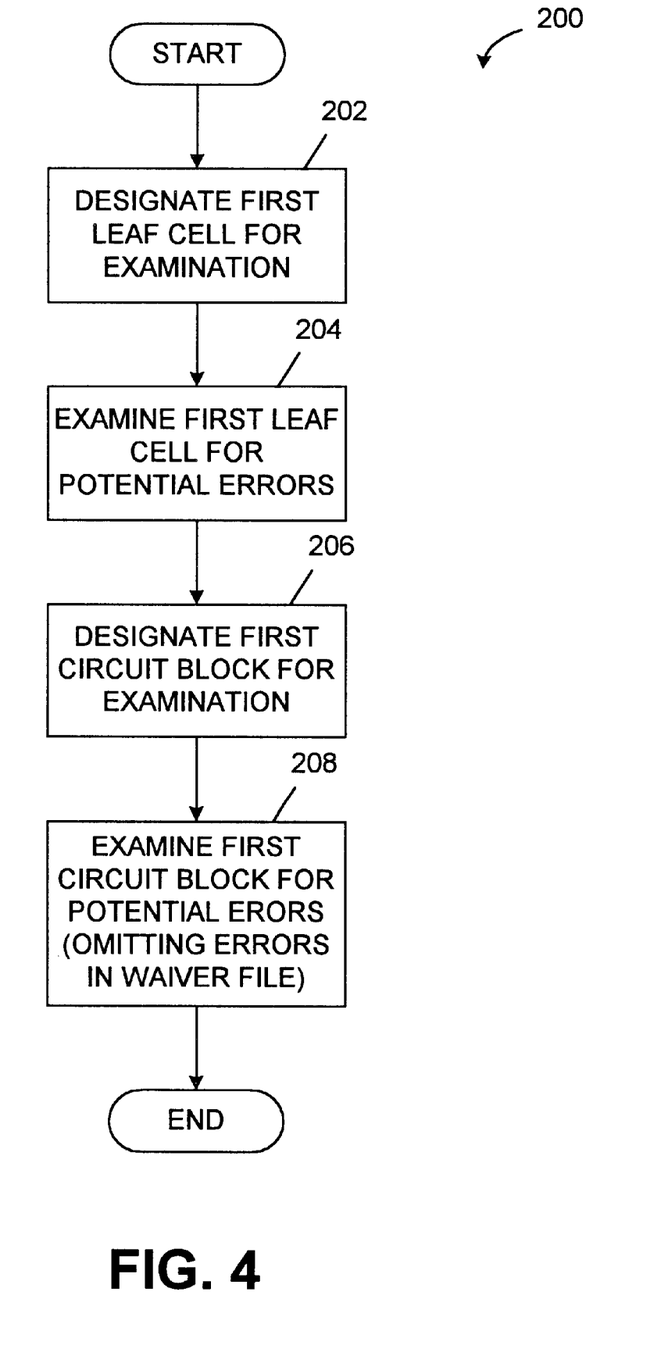
FIG. 4 is a flow chart illustrating the top-level functional operation of the design evaluation tool of the present invention.

Having described the top-level structure and operation of the present invention in the context of the block diagrams of FIGS. 1A and 1B and the schematic diagrams of FIGS. 2 and 3, reference is now made to FIG. 4 which is a flowchart 200 illustrating the top level functional operation of a method constructed in accordance with one aspect of the present invention. In this regard, one aspect of the present invention may be viewed as a method that involves designating a first leaf cell for examination (step 202), examining the first leaf cell for potential errors (step 204), then designating a first circuit block for examination (step 206), and examining the first circuit block for potential errors (step 208). Generally, step 208 will further include omitting from identification any errors that have been waived by the circuit designer.

In operation, the evaluation tool of the present invention may evaluate a designated circuit portion for all errors in a predefined list of errors. Once errors are identified, the method may omit errors that are separately listed in a waiver file. This waiver file, as previously described, lists conditions that would otherwise be designated as errors, but which the designer has specifically instructed the system to ignore for purposes of evaluation. Alternatively, the method may examine the waiver file before examining the circuit for potential errors, and examine the circuit only for those errors that the evaluation tool would otherwise check for, but exclude potential errors that are listed in the waiver file. This is a preferable approach because it more efficiently evaluates the circuit design by adding the time required to identify errors that are to be waived.

The step of designating a first leaf cell for examination simply involves the step of the designer specifying to the evaluation tool a portion of the netlist file that is to be evaluated by the evaluation tool. There may be a wide variety of manners in which the designation step may be carried out, consistent with the broader concepts of the present invention. The examination step of the first leaf cell is carried out by the evaluation tool, wherein the evaluation tool essentially ignores the remainder of the netlist file and focuses only on the designated portion. Similar steps are carried out with regard to the designation and examination of the first circuit block. The difference, and as described above, is simply that the first circuit block is generally larger than (and indeed usually encompasses) the first leaf circuit.

Figure 5A:
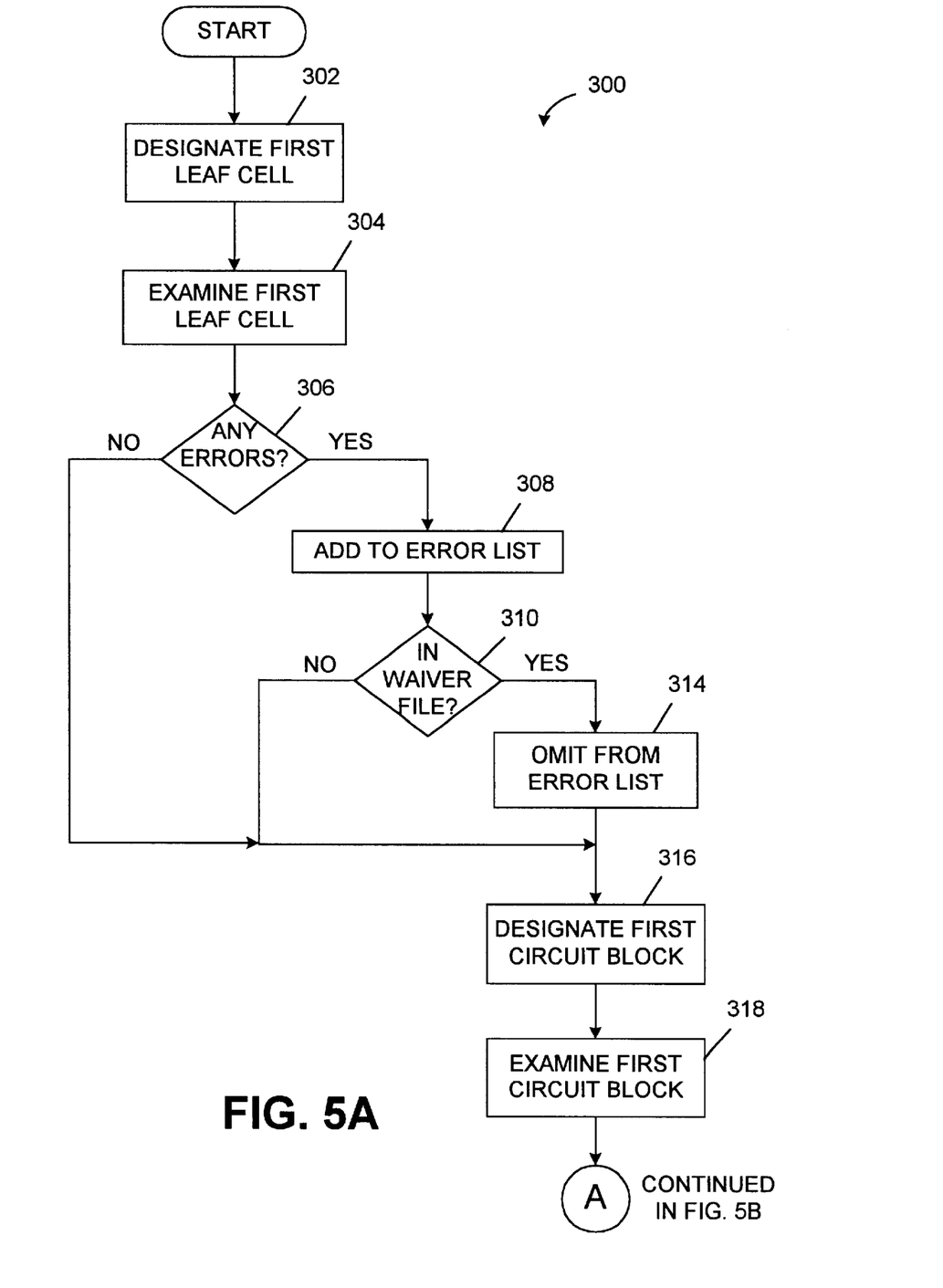
FIGS. 5A and 5B comprise a flow chart illustrating more operational detail of the design evaluation tool of the present invention.
Figure 5B:
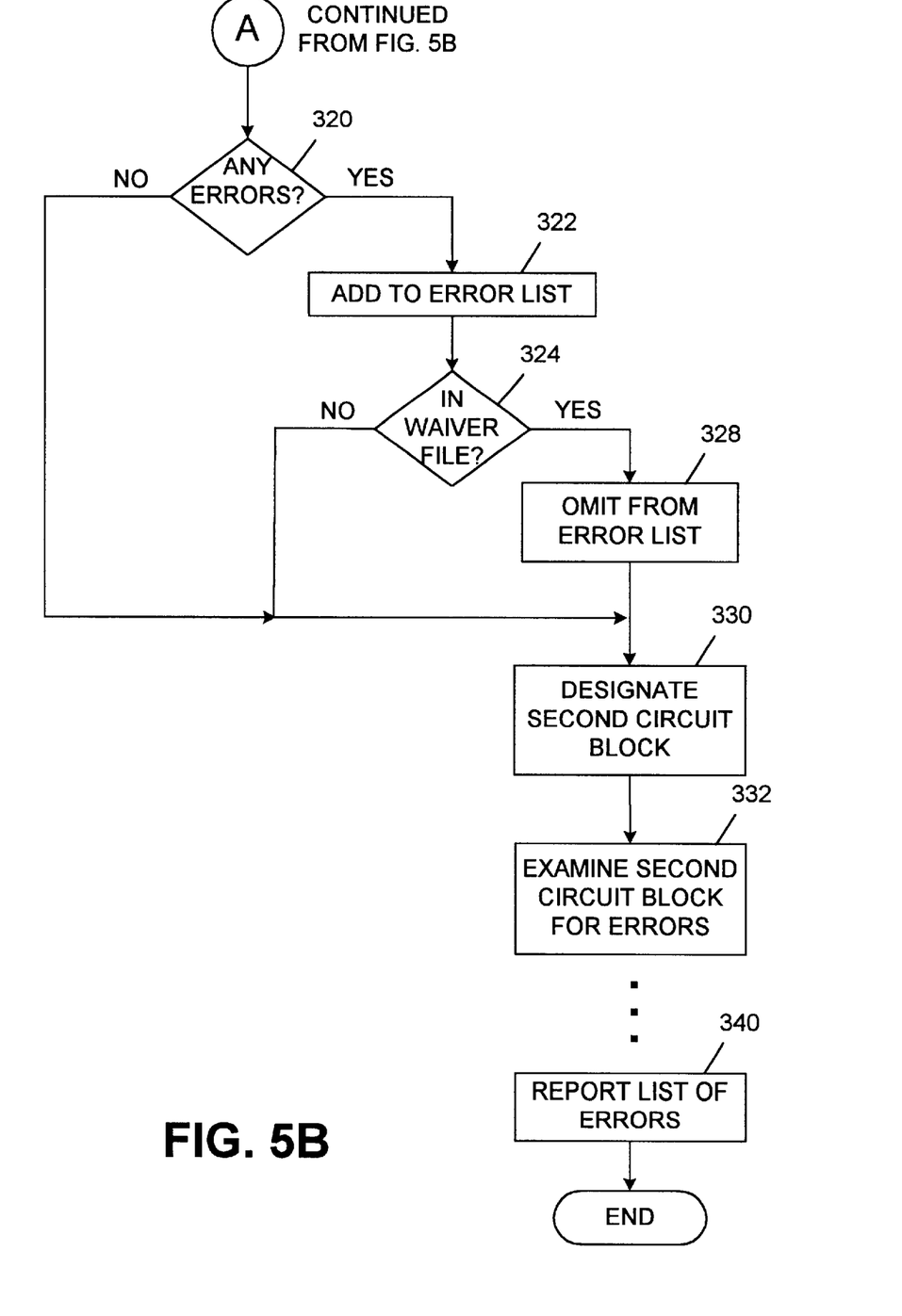

Reference is now made to FIGS. 5A and 5B, which collectively depicted a flowchart 300 that illustrates a preferred embodiment of the present invention, in more detail than that illustrated in the flowchart of Fig. 4. As mentioned above, the embodiment illustrated performs the steps of designating a first leaf cell (step 302) and examining the first leaf cell for errors (step 304). If any errors, or potential errors, are identified (step 306), then they may be added to an error list (step 308), to ultimately be reported to the designer. Before this list is reported to the designer, however, the method may evaluate each error, or potential error, to determine whether it exists in a waiver file (step 310). As previously mentioned, this waiver file may contain a listing of various tests or potential errors (or tests) that the designer has decided should not affect the circuit. For each error, or potential error, that exists in the waiver file, the method may then omit this error from the list of errors, or potential errors (step 314).

It should be appreciated that the blocks illustrated in the flowchart 300 are merely presented for purposes of illustrating the general functional operation of the present invention. Block numbers 306, 308, 310, and 314 may be alternatively configured. In this regard, the illustrated embodiment contemplates that the evaluation tool will evaluate the netlist for every potential error that the evaluation tool is configured to identify. Then, after identification of such errors, the evaluation tool omits from the error listing any errors (or tests) that are also listed in a waiver file. In one embodiment of the present invention, instead of evaluating the netlist file for every possible error, the method evaluates the netlist file for every error except those listed in the waiver file. As will be appreciated, this implementation achieves a greater level of efficiency in that it need not spend time identifying errors in the circuit design that are ultimately to be ignored.

After evaluating the netlist file for potential errors in a designated leaf cell, the method proceeds by executing the steps of designating a first circuit block (step 316) and examining the first circuit block for potential errors (step 318). Although not shown, additional, interim examination routines may also be performed on additional leaf cells. The evaluation of the first circuit block will proceed in much the same way as the evaluation of the leaf cell, described above. In this regard, the method may evaluate that portion of the netlist corresponding to the designated circuit block to identify any errors or potential errors (step 320). Any errors so identified may be added to a list of errors (step 322). Thereafter, the method may determine whether any identified error is listed in a waiver file (step 324). If so, then the method may omit the identified error from the error list (step 328).

The method may proceed by performing the steps of designating a second circuit block (step 330) and evaluating the second circuit block for errors (step 332). This pattern of evaluation may be repeated numerous times as the evaluation tool proceeds through the hierarchy of the circuit, in accordance with present invention. Once all circuit evaluation has been completed, then the method may report to the designer all errors that are contained within the listed errors, or potential errors (step 340), so that the designer may take the appropriate corrective action. As discussed above, this appropriate corrective action will generally be either to modify the circuit design to correct the identified error or to list of the error (or tests) in a waiver file so that it is not identified in connection with a subsequent evaluation of the circuit.

While the invention has been described above in connection with a method for evaluating a netlist, it will be appreciated that, in accordance with another aspect of the invention, a system may also be provided. Preferably, the system will be provided, in part, in the form of a computer readable storage medium that is configured to execute on a computer having a processor.

Figure 6:
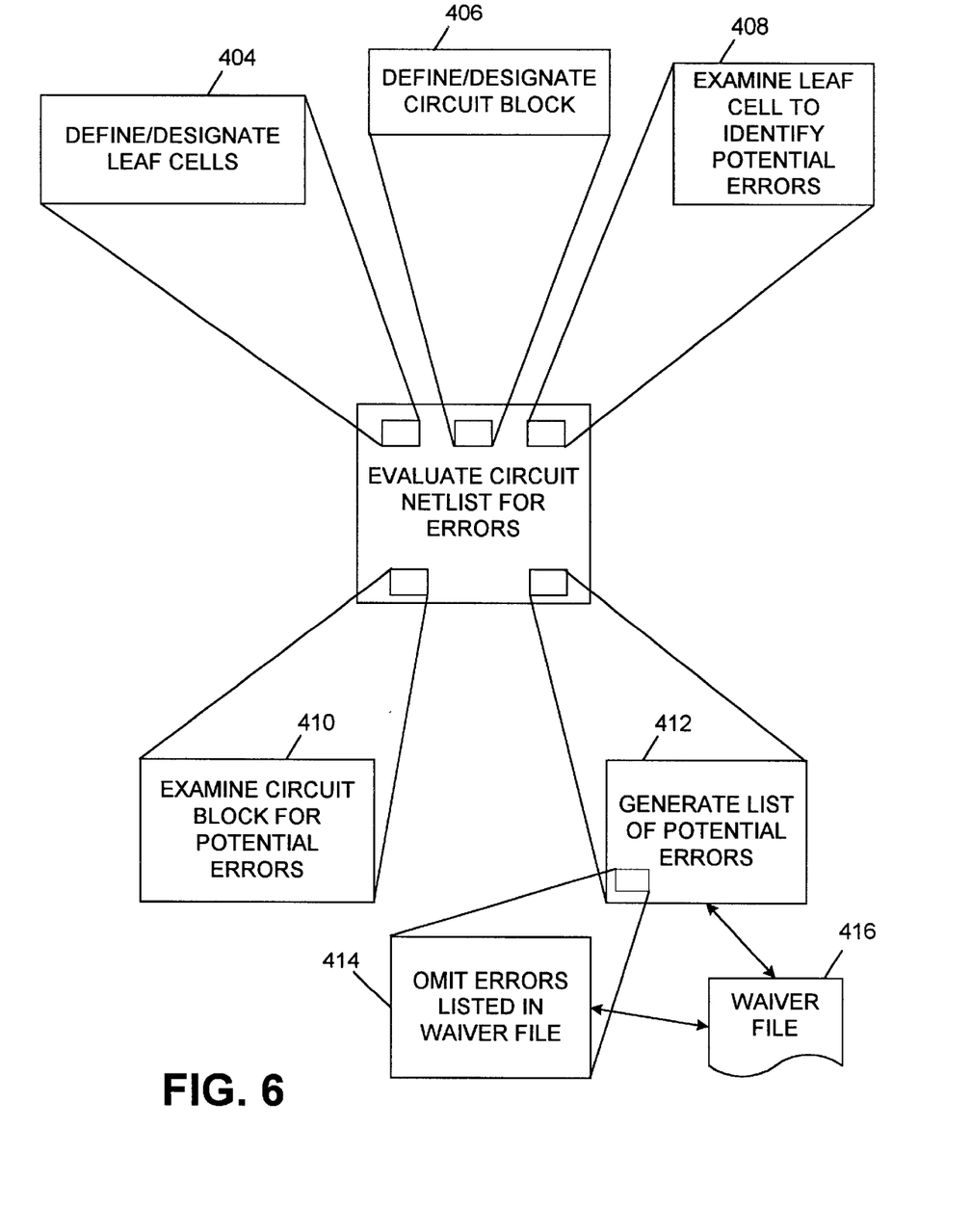
FIG. 6 is a block diagram illustrating certain fundamental code segments comprising a system constructed in accordance with the invention.

In this regard, reference is now made to FIG. 6 which illustrates certain functions which may be carried out by a system that is configured to evaluate a circuit netlist for errors, constructed in accordance with the teachings of the invention. For example, the system may include a plurality of code segments that perform a variety of individual functions. For example, one segment 404 may be configured to allow a designer to designate leaf cells within a netlist. Another segment 406 may be provided for designating larger circuit blocks within a netlist. Another segment 408 may be provided for examining leaf cells to identify potential errors. Still another segment 410 may be configured to examine designated circuit blocks for potential errors. Another segment 412 may be configured to generate a list of potential errors. In connection with this segment, a further segment 414 may be configured to omit errors from the listing, that are contained within a waiver file. In this regard, a waiver file 416 may be accessed by segments 412 and 414. Yet additional segments (not illustrated) may be provided in connection with the system of the present invention. As will be appreciated by persons of skill in the art in light of the teachings provided herein.

In should be appreciated that the flow charts of FIGS. 4, 5A, and 5B show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 4, 5A, and 5B. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for examining a netlist file to evaluate a circuit design comprising the steps of:
    (a) designating a first leaf cell for examination;
    (b) examining the first leaf cell for potential design errors;
    (c) designating a first circuit block for examination, the first circuit block containing the first leaf cell;
    (d) examining the first circuit block for design errors, wherein the step of examining the first circuit block includes the step of evaluating a waiver file and ignoring potential errors that are identified in the waiver file.

2. The method as defined in claim 1, wherein the step of examining the first leaf cell includes the step of evaluating a waiver file and ignoring potential errors that are identified in the waiver file.

3. The method as defined in claim 1, wherein the step of designating a first leaf cell includes identifying a type of circuit configuration defined by the leaf cell.

4. The method as defined in claim 3, wherein the step of examining the first leaf cell includes performing a predefined list of evaluations on the first leaf cell, the predefined list being uniquely directed to the first leaf cell.

5. The method as defined in claim 1, wherein the step of examining the waiver file further includes the step of ignoring potential errors on a per leaf cell basis.

6. The method as defined in claim 1, further including the step of building a waiver file following the step of examining the first leaf cell, wherein the potential errors identified in the step of examining the first leaf cell are evaluated, and at least one of these potential errors are deemed to be disregarded and the at least one of these potential errors are added to the waiver file so that the at least one error is disregarded in the step of examining the first circuit block.

7. The method as defined in claim 1, further including the step of:
    (b2) designating a second leaf cell for examination, wherein the first circuit block encompasses both the first leaf cell and the second leaf cell.

8. The method as defined in claim 1, further including the step of:
    (e) designating a second circuit block for examination, wherein the second circuit block encompasses the first circuit block.

9. The method as defined in claim 1, further including the step of generating a first list of potential errors, wherein the step of evaluating the first leaf includes evaluating the first leaf for each potential error in the first list of potential errors.

10. The method as defined in claim 1, further including the step of generating a second list of potential errors, wherein the step of evaluating the first circuit block includes evaluating the first circuit block for each potential error in the second list of potential errors.

11. The method as defined in claim 1, wherein the step of examining the first leaf cell includes examining the first leaf cell for potential errors that are associated with a type of circuit configuration that is specified by the first leaf cell.

12. A system for examining a netlist file to evaluate a circuit design comprising:
    leaf designating means for designating at least one leaf circuit cell for examination;
    leaf examining means for examining the at least one leaf circuit cell for potential design errors;
    block designating means for designating at least one circuit block for examination, the at least one circuit block containing the at least one leaf cell; and
    block examining means for examining the first circuit block for design errors, wherein the block examining means includes the means for evaluating a waiver file and ignoring potential errors that are identified in the waiver file.

13. The system as defined in claim 12, wherein the leaf designating means, the leaf examining means, the block designating means, the block examining means, and the means for evaluating the waiver file are each implemented as a portion of code for execution by a processor.

14. The system as defined in claim 12, wherein the leaf designating means is configured to identify a type of circuit configuration defined by the at least one leaf cell.

15. The system as defined in claim 14, wherein the lead examining means is configured to perform a predefined list of evaluations on the at least one leaf cell, the predefined list being uniquely directed to the at least one leaf cell.

16. The system as defined in claim 12, wherein the means for examining the waiver file is configured to ignore potential errors on a per leaf cell basis.

17. A method for evaluating a very large scale integrated circuit design comprising the steps of:
    examining a first circuit portion for a variety of potential errors;
    generating a first list of potential errors identified in the first circuit portion;
    adding at least one of the potential errors to a waiver file;
    examining a second circuit portion for a variety of potential errors, the second circuit portion encompassing the first circuit portion;
    generating a second list of potential errors identified in the second circuit portion; and
    omitting from the second list all errors identified in the waiver file.

18. The method as defined in claim 17, wherein the step of examining the first circuit portion examines the first circuit portion for a first plurality of specified errors.

19. The method as defined in claim 18, wherein the step of examining the second circuit portion examines the second circuit portion for a second plurality of specified errors, wherein the second plurality of specified errors is different from the first plurality of specified errors.

\* \* \* \* \*